June 28, 1955 W. J. FRANTZ 2,712,062

CONVERTER CIRCUITS

Filed April 12, 1949 2 Sheets-Sheet 1

INVENTOR
Walter J. Frantz
BY Harry Tunick
ATTORNEY

INVENTOR
Walter J. Frantz
BY Harry Tunick
ATTORNEY

United States Patent Office 2,712,062

Patented June 28, 1955

2,712,062

CONVERTER CIRCUITS

Walter J. Frantz, Seahurst, Wash., assignor to Radio Corporation of America, a corporation of Delaware Application April 12, 1949, Serial No. 87,084

18 Claims. (Cl. 250—20)

The invention relates to ultra high frequency receivers and it particularly pertains to improvements in crystal converter circuits for wide band U. H. F. receivers.

The frequency band allotted for experimental color television broadcasting at the present time is on the order of 500 mc./s. and higher, at which frequencies video bandwidths of 10 mc./s. or more are considered necessary in order to successfully transmit a satisfactory picture.

Under these conditions it has been proposed to use superheterodyne receivers having crystal or diode converters of known type due to their inherent simplicity, dependability and compactness. The converters known to the art, however, inherently permit local oscillator radiation to a high degree, which radiation is expected to become an extremely serious problem as the number of television receivers operating in the 500 mc./s. television band increases in view of the impracticability of tuned R. F. amplifier stages at these frequencies.

It is an object of the invention, therefore, to provide an U. H. F. superheterodyne receiver crystal converter arrangement having an extremely low radiation of the locally generated oscillations.

It is another object of the invention to provide an U. H. F. converter circuit arrangement in accordance with the foregoing object while retaining the simplicity, dependability and compactness of the prior art arrangements.

It is a further object of the invention to provide an U. H. F. converter circuit having a low noise factor.

It is still another object of the invention to provide a converter arrangement suitable for U. H. F. superheterodyne receivers wherein the coupling to the local oscillator and the intermediate frequency leads are not exposed in the region of the radio frequency circuitry.

These and other objects of the invention which will appear as the specification progresses are attained by means of a crystal converter circuit arrangement in which the locally generated oscillations are applied to the R. F. circuits by means of a shielded coaxial line terminating at the crystal terminal which is located internally of a conductor of the R. F. circuit.

The invention will be described with reference to the accompanying drawing forming a part of the specification and in which.

Figure 1:
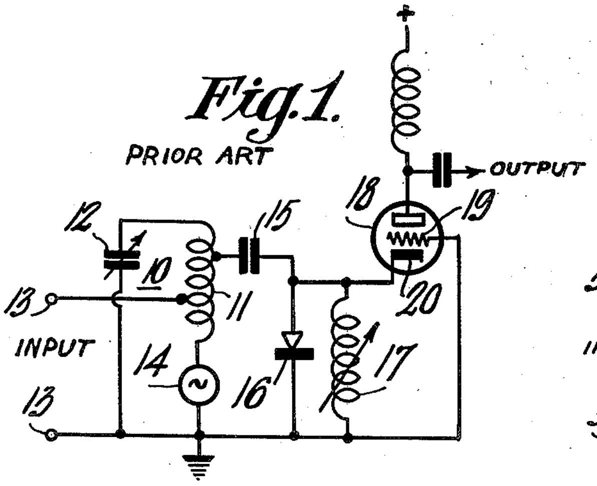
Fig. 1 is a schematic diagram of a crystal converter known to the art.

In order to more clearly point out the distinguishing features of the invention a brief discussion of a prior art arrangement is believed helpful. Referring to Fig. 1 there is shown a simplified schematic diagram of the known converter wherein it is customary at U. H. F. to employ coils and capacitors, tapped coils, sections of transmission line, etc. to provide the desired R. F. circuit 10 comprising an inductance element 11 and capacitance element 12 by variation of the values of which the circuit 10 is tuned to the frequency of the incoming signal applied at terminals 13. The voltage developed in resonant circuit 10 in response to the incoming signal is applied in series with a voltage obtained from a local oscillator 14, of conventional construction, via a coupling capacitor 15 to a crystal converter element 16. The beat frequency component, which is usually the difference between the signal frequency and the frequency of the locally generated oscillation, is obtained across a suitable load element 17, shown here as a variable inductor and applied to the input of an intermediate frequency amplifier tube 18, the control grid 19 being grounded and the cathode 20 being connected to the hot end of inductor 17. It is understood, of course, that several other intermediate frequency amplifier schemes have also been employed in the prior art, the grounded grid amplifier being shown merely as an example.

While no specific constructional details of the conventional arrangements are shown, it can be seen from an inspection of the schematic diagram of Fig. 1 that by virtue of the match between the crystal resistance and the antenna resistance the power reaching the antenna and thereby radiated is the same as the power reaching crystal 16 regardless of the Q of tuned circuit 10 or how far it may be detuned from the local oscillator frequency. Therefore, the radiated local oscillator power as well as the power to crystal 16 can be expressed as $I^2R_c$ where $R_c$ is the resistance of crystal 16 and I is the optimum crystal current. For a 1N21 type crystal having a resistance of approximately 300 ohms and capable of carrying an optimum current of 0.5 milliampere, the calculated radiated power is on the order of 75 microwatts. These undesirable features are eliminated according to the underlying principles of the invention which will be seen in reference to Fig. 2 in which there is shown a portion of a receiver chassis 21 on which the converter and oscillator circuits are arranged in individual shields 22 and 23 respectively (shown in phantom). Within shield 22 a pair of conductors 25 and 26 are arranged with their lower ends electrically connected to chassis 21 and having semi-circular plates 27 and 28 mounted on their upper ends. A circular plate 29 is arranged to be supported in registry with plates 27 and 28 by an adjusting screw member 31 passing through shield 22 and which may be arranged therein by any convenient mounting means that will permit adjustment of plate 29 with respect to plates 27 and 28. While any known means for coupling an antenna to the foregoing circuit may be employed, in actual practice a two wire transmission line 24 preferably is connected at a point near the lower ends of conductors 25 and 26 to provide the proper impedance match. If desired, a coaxial input line may be readily adapted to the circuit illustrated. Conductors 25 and 26 are of large cross-sectional area in order to provide the highest possible Q and to effect the shielding of the crystal as hereinafter described. At a suitable height from the lower ends of conductors 25 and 26 to provide the proper coupling, complementary cavities 35 and 36 are arranged in conductors 25 and 26 to receive a crystal cartridge 37 which is held securely in place by means of a plug 40 screwed into the wall of cavity 35 and pressing on rim 38 of cartridge 37. A collar 41 is snugly fitted to nose 39 of cartridge 37 and electrically connected to a wire 44 coaxially positioned within a channel 46 bored in the lower end of conductor 36. Collar 41 and cavity 36 are so proportioned to provide the desired capacitive coupling between crystal 37 and the tuned circuit comprising conductor 25 and 26 and plates 27—29. Wire 44 after passing through chassis 21 is the center conductor of a coaxial transmission line having outer conductor 47 bonded to chassis 21. Center wire 44 is carried up into the local oscillator compartment 23 wherein it is formed into a loop 44' whereby energy is obtained from the local oscillator of which only the tuned circuit line 48 is shown, it being understood that any conventional U. H. F. oscillator may be employed with satisfactory results. Wire 44 is carried back through chassis 21 to form a length of coaxial line the outer conductor 49 of which is again bonded to chassis 21. Wire 44 is brought to one terminal of inductor 17, the other terminal of which is grounded. Preferably the cathode 20 of the intermediate amplifier tube 18 is connected to inductor 17 by means of a tapping 49. It is, of course, understood that wire 44 and its associated sheath need not be constructed as shown but may be made up of several short lengths of coaxial cable and wire, a length of coaxial cable modified to suit the purpose, or any one of a number of variations that will be suggested to the artisan.

Figure 3:
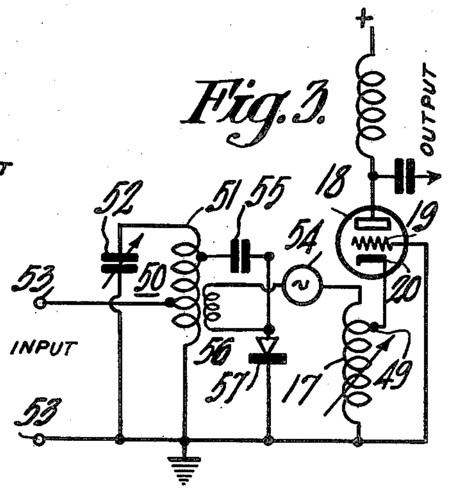
Fig. 3 is a schematic diagram of a crystal converter according to the invention as illustrated in Fig. 2.
Figure 2:
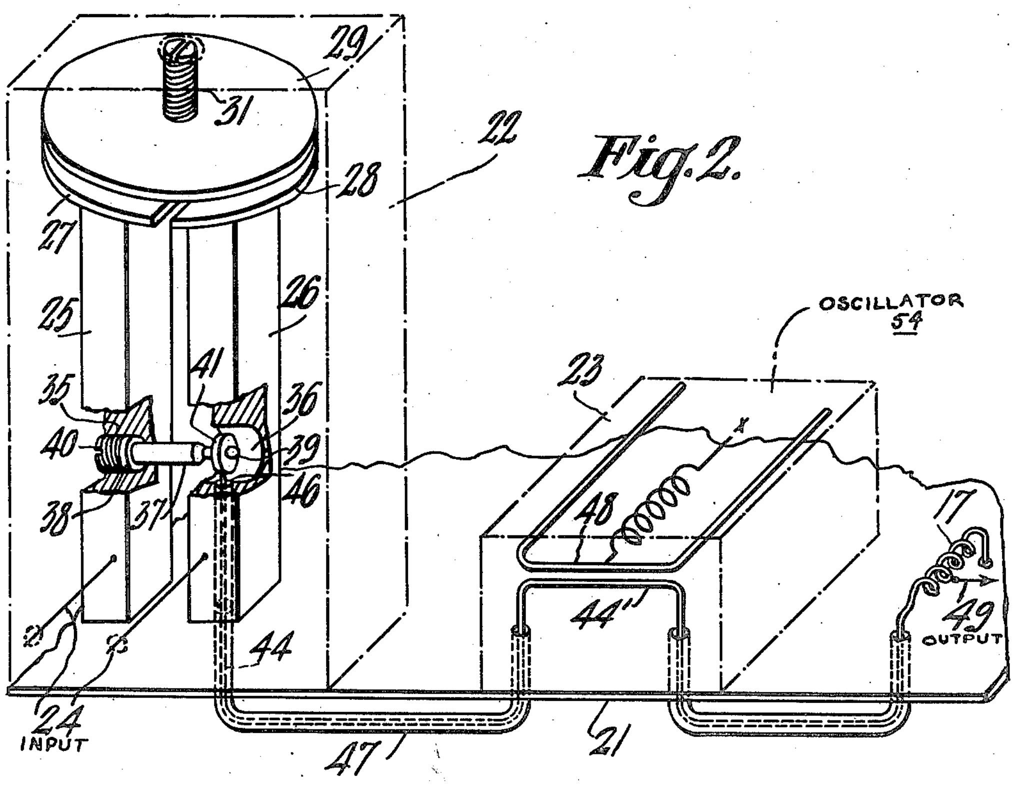
Fig. 2 is an illustration of an arrangement according to the invention.

In Fig. 3 there is shown the equivalent schematic diagram of the arrangement shown in Fig. 2. The resonant circuit formed by conductors 25 and 26 and plates 27—29 is represented at 50 by the usual symbols for inductance 51 and capacity 52. Connections for an antenna or input transmission line 53 are shown at the equivalent point where the two-wire input transmission line previously described is connected at the proper impedance matching point up from the lower end of conductors 25 and 26 in the construction shown in Fig. 2. The voltage developed in resonant circuit 50 in response to the incoming signal is applied to crystal 57 corresponding to crystal cartridge 37 by means of capacity coupling between conductor 26 and collar 41 of Fig. 2, which capacity is represented by the usual symbol for a capacitor 55. The locally generated oscillation, obtained as indicated by the usual oscillator symbol 54 is applied to crystal 57 via inductor 17, and an inductor 56 coupled to inductor 51 to show the mutual coupling between the resonant circuit 50 and the crystal line. This mutual coupling decouples the resonant circuit 50 from local oscillator 54 save for the small flow of crystal current. The intermediate frequency amplifier is indicated by tube 18 as for Fig. 1 except that the connection to cathode 20 is made via tapping 49.

Since the input transmission line 24 is tapped onto conductors 25 and 26 at a point whereby the antenna resistance is matched to the crystal resistance, the maximum power into the antenna again is expressed by $I^2R_c$ or by $E^2/R_a$ where E is the voltage appearing across the antenna resistance $R_a$. But due to the circuit arrangement according to the invention this maximum power will be transferred to the antenna only when the R. F. circuit is resonant to the frequency generated by the local oscillator. Since the R. F. circuit is not resonant to the local oscillator frequency but to the signal frequency, the local oscillator voltage reaching the antenna is approximately $$\frac{E}{2Q}\Big/\left(\frac{\omega_0-\omega_i}{\omega_0}-\frac{\omega_0}{\omega_0-\omega_i}\right)$$

where Z is the effective Q of the R. F. circuit, $\omega_0$ is $2\pi\times$ the signal frequency; $\omega_i$ is $2\pi\times$ the intermediate frequency and $\omega_0-\omega_i$ is $2\pi\times$ the local oscillator frequency. The Q of the R. F. circuit is equal to $$\frac{\omega_0}{\omega_\Delta}$$

where $\omega_\Delta$ is the desired bandwidth in radian/sec. The factor 2 appears because the crystal resistance and the antenna resistance contribute equally to the damping of the tuned circuit. The above equation reduces to $$\frac{E}{2Q}\,\frac{\omega_0}{\omega_i}=\frac{(\omega_0-\omega_i)}{(\omega_i-2\omega_0)}$$

and for $\omega_i \ll \omega_0$ reduces to $$\frac{E}{4Q}\,\frac{\omega_0}{\omega_i}$$

Substituting $$\frac{\omega_0}{\omega_\Delta}$$

for Q the voltage is expressed as $E\omega_\Delta/4\omega_i$ or the local oscillator voltage reaching the antenna in the circuit arrangement of the invention is $\omega_\Delta/4\omega_i$ times the voltage reaching the antenna in the known arrangements. Therefore, the power radiated will be less by a factor $(\omega_\Delta/4\omega_i)^2$, hence, for the 1N21 crystal and $(\omega_\Delta/\omega_i)=0.1$, the calculated radiated power would be .046 microwatt, a theoretical advantage of 1600.

The known arrangement as shown in Fig. 1 and the arrangement according to the invention were tested under identical conditions resulting in a radiated power of 64 microwatts for the converter according to the invention, an actual advantage of 220.

Figures 4, 5A:
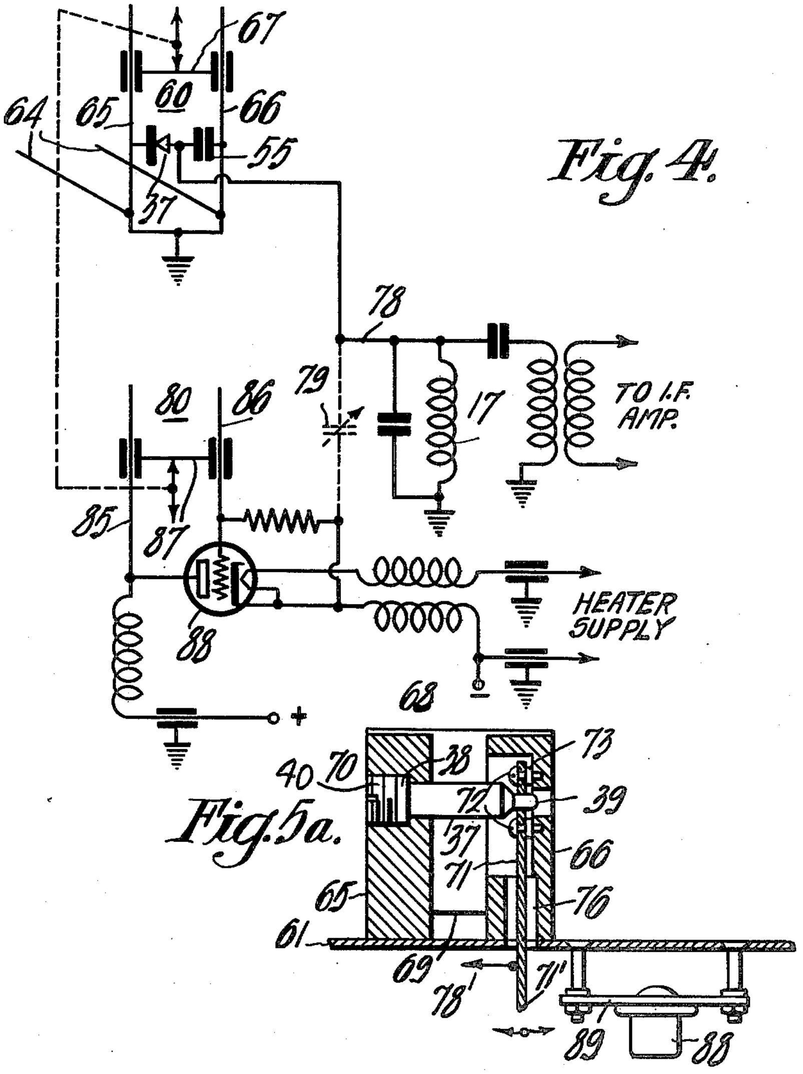
Fig. 4 is a schematic diagram of another converter arrangement according to the invention; and Figs. *5a* and *5b* illustrate a portion of the construction of the converter arrangement represented schematically in Fig. 4.
Figure 5B:
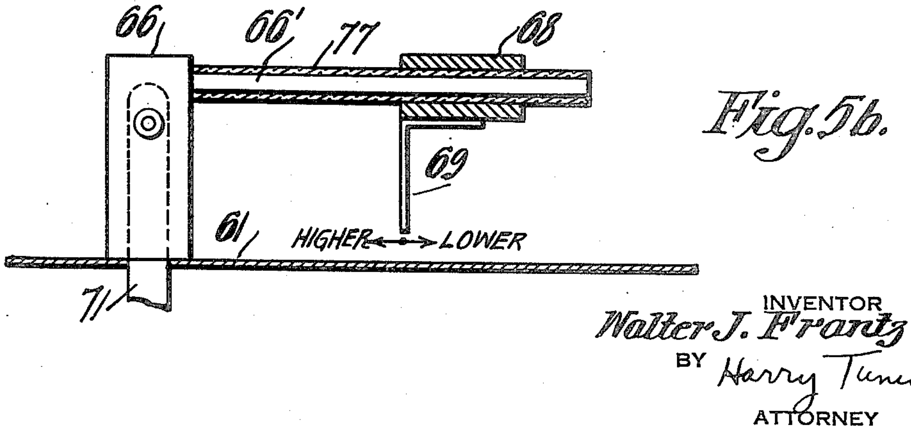

An alternate embodiment of a converter according to the invention is shown in Figs. 4 and 5, the circuit arrangement being shown in Fig. 4 wherein an input signal is applied by means of a two-wire transmission line 64 to a tuned circuit 60 comprising conductors 65 and 66 and tuning device 67. The actual construction of tuned circuit 60 is shown in Fig. 5 from which it will be seen that conductors 65 and 66 are similar to conductors 25 and 26 of the arrangement of Fig. 2 but are somewhat shorter in length and tuning is accomplished by varying a bridge 67 which comprises a slider 68 mounted to move upon a pair of rods 65' and 66' arranged at right angles near the top of conductor 65 and 66. Slider 68 is insulated from rods 65' and 66' by means of concentric insulating tubes 77 shown in cross-section at Fig. 5G. Additional capacity variation is obtained by means of an L-shaped plate 69 affixed to the underside of slider 68. The high frequency end of the tuning range is obtained with slide 68 nearest conductors 65 and 66. Crystal 37 is mounted in conductors 65 and 66 in much the same fashion or described with reference to Fig. 2 except that instead of a collar 41 and wire 42 a flat strip of metal 71 is arranged inside conductor 66. Strip 71 is preferably fastened within conductor 66 by screws 72 passing through insulating bushings 73 to align strip 71 in bore 76. Capacitor 55 is effected by the capacity between strip 71 and conductor 66. A lead 78 is brought off strip 71 and connects the converter to inductor 17 of the intermediate frequency amplifier input stage. While a coupling loop may be interposed in lead 78 and coupled to the tuning circuit of the local oscillator, preferably strip 71 is located near the local oscillator, which is shown as a tuned circuit 80 comprising a pair of conductors 85 and 86 tuned by means of a slide 87 along the lines of tuned circuit 60 and connected to a triode oscillator tube 88 but which may be any form of oscillator known to the art, to provide sufficient pickup of the oscillations generated. The coupling is shown as a capacitor 79 in the schematic diagram of Fig. 4. The degree of coupling is varied by bending end portion 71' of strip 71 closer to or farther from the oscillator tube socket 89. It should be noted that mounting the oscillator tube 88 and socket 89 under chassis 61 not only provides a compact structure but effectively shields the tuned circuit 60 from the oscillator circuit as well.

While the invention has been described in terms of express embodiments, it is understood that various modifications will be suggested to those skilled in the art without departing from the spirit and the scope of the invention.

What is claimed is:

1. A converter arrangement for a superheterodyne receiver including a conductive surface member, a pair of elongated conductors arranged normal to and on one side of said conductive surface member, further conductors arranged to be adjusted with respect to said conductors, said conductors having complementary bores therein, one of said conductors having a further axially located bore therein passing from the first-mentioned bore to the other side of said conductive surface member, a conductive member arranged in said further bore and extending beyond said conductive surface member, a detector element, means to mount said detector in said complementary bores, said detector element being connected to said conductive member, means to apply radio frequency currents of given frequency to said conductors, means to connect an output load circuit tuned to a predetermined frequency to said conductive member, and a source of locally generated signal of frequency differing from said given frequency by said predetermined frequency arranged in proximity to that portion of said conductive member extending beyond said conductive surface member to capacitively couple said source to said detector element, said conductive member being fictile to permit the degree of coupling to be varied.

2. A converter circuit for a superheterodyne receiver including a tunable transmission line section having a pair of elongated conductors, a detector element and a capacitive reactance element connected in series across said conductors, an amplifier input circuit, a lead interconnecting said amplifier input circuit, and said detector element at the junction between said detector element and said capacitive reactance element, a local oscillator having an output circuit, and a further reactance member coupling said local oscillator circuit to said lead, said local oscillator circuit being coupled to said tunable transmission line section solely through said detector and capacitive reactance elements, thereby reducing radiation from said transmission line section at the frequency of said local oscillator to a minimum.

3. A converter circuit for a superheterodyne receiver including a tunable transmission line section having a pair of elongated conductors connected at one end to a point of fixed reference potential, a detector element and a capacitive reactance element connected in series across said conductors at points removed from the connections to said point of fixed reference potential, an amplifier input circuit having one terminal at said point of fixed reference potential, a lead interconnecting said amplifier input circut and said detector element at the junction between said detector element and said capacitive reactance element, a local oscillator having an output circuit, and a reactance component coupling said local oscillator output circuit to said lead, said local oscillator being coupled to said tunable transmission line section solely through said detector and capacitive reactance elements, thereby reducing radiation from said transmission line section at the frequency of said local oscillator to a minimum.

4. A converter circuit for a superheterodyne receiver including a tunable transmission line section having a pair of large cross-section elongated conductors connected at one end to a point of fixed reference potential, said conductors having complementary bores therein, a crystal diode element arranged in said bores, one terminal of said crystal diode element being directly connected to the adjacent conductor and the other terminal being capacitively coupled to the other conductor, an amplifier input circuit having one terminal at said point of fixed reference potential, said other conductor having a further axial bore connected to the first bore located therein, an electric lead arranged in said further axial bore and interconnecting said crystal diode element and said amplifier input circuit, a local oscillator circuit, and a loop element in said electric lead, and means coupling said local oscillator circuit to said loop element.

5. A converter arrangement for a superheterodyne receiver including a conductive surface member, a pair of elongated conductors arranged normal to and on one side of said conductive surface member, a conductive element arranged to be adjusted with respect to said conductors, said conductors having complementary bores therein, one of said conductors having an axially located bore therein passing from the first mentioned bore located in said conductor to the other side of said conductive surface member, a further conductive member arranged in said further bore and extending beyond said conductive surface member, a detector element arranged in said complementary bores, one terminal of said detector element being connected to one of said elongated conductors and the other to said further conductive member, means to apply radio frequency currents of given frequency to said conductors, means to connect an output load circuit tuned to a predetermined frequency to said further conductive member, a source of locally generated signal of frequency differing from said given frequency by said predetermined frequency, and a loop element in that portion of said conductive member extending beyond said conductive surface member to induce the output of said locally generated signal source in said further conductive member.

6. A converter arrangement for a superheterodyne receiver including a conductive surface member, a pair of elongated conductors arranged normal to and on one side of said conductive surface member, a conductive element arranged to be adjusted with respect to said conductors, said conductors having complementary bores therein, one of said conductors having an axially located bore therein passing from the first mentioned bore to the other side of said conductive surface member, a further conductive member arranged in said further bore and extending beyond said conductive surface member, a detector element arranged in said complementary bores, one terminal of said detector element being connected to one of said elongated conductors and the other to said further conductive member, means to apply radio frequency currents of given frequency to said conductors, means to connect an output load circuit tuned to a predetermined frequency to said further conductive member, a source of locally generated signal of frequency differing from said given frequency by said predetermined frequency, and means to couple the output of said locally generated signal source to that portion of said further conductive member extending beyond said conductive surface member.

7. A converter circuit for a superheterodyne receiver, including a resonant circuit tuned to the frequency of a desired wave, said resonant circuit comprising a pair of conductors spaced apart and having complementary bores arranged therein, one of said conductors having a further axial bore connecting with the first bore located therein, a diode detector element arranged in said complementary bores, a conductive member arranged in said further bore and connected to said diode detector element, means to apply a voltage of the frequency of said desired wave to said resonant circuit, an amplifier input circuit tuned to an intermediate frequency, a local oscillator circuit tuned to a frequency differing from the frequency of said resonant circuit by said intermediate frequency, and means to couple said oscillator circuit and said amplifier input circuit to said conductive member.

8. A converter circuit for a superheterodyne receiver, including a resonant circuit tuned to the frequency of a desired wave, said resonant circuit comprising a pair of conductors spaced apart and having complementary bores arranged therein, one of said conductors having a further axial bore connecting with the first bore located therein, a crystal detector element arranged in said complementary bores, a conductive member arranged in said further bore and connected to said crystal detector element, means to couple an antenna to said resonant circuit, an amplifier input circuit tuned to an intermediate frequency, a local oscillator circuit tuned to a frequency differing from the frequency of said resonant circuit by said intermediate frequency, and means to couple said oscillator circuit and said amplifier input circuit to said conductive member, said conductive member coacting with the internal wall of said further bore substantially to decouple said oscillator circuit from said resonant circuit and couple said crystal detector element to said resonant circuit, thereby to minimize radiation at said different frequency.

9. A converter circuit for a superheterodyne receiver, including a resonant circuit comprising a pair of conductors spaced apart a conductive element insulated from said conductors and arranged in adjustable relationship thereto to tune said resonant circuit, said conductors having complementary bores arranged therein, one of said conductors having a further axial bore in communication with the first bore located therein, a crystal detector cartridge arranged in said complementary bores, a conductive member arranged in said further bore to form a capacitor in conjunction with the internal walls of said one conductor and connected to said crystal detector cartridge, means to couple a source of radio frequency waves to said conductors, an amplifier input circuit connected to said conductive member, a local generator of oscillations arranged in proximity to said conductive member to couple said local generator to said crystal detector, and means to adjust said conductive member to vary the coupling between said local generator and said crystal detector.

10. A converter circuit for a superheterodyne receiver, including a resonant circuit comprising a pair of conductors spaced apart a conductive element from said conductors in adjustable relationship to tune said resonant circuit, said conductors having complementary bores arranged therein, one of said conductors having a further axial bore arranged therein in communication with the first bore located therein, a crystal detector cartridge arranged in said complementary bores, a conductive element connected to a terminal of said crystal detector cartridge to form a capacitor in conjunction with the internal walls of said one conductor, arranged in said further bore and connected to said crystal detector cartridge at said conductive element, means to couple a source of radio frequency waves to said conductors, an amplifier input circuit connected between said point of fixed reference potential and the remaining end of said conductive member, said conductor being arranged in the form of a loop at a point intermediate the ends thereof, a local generator of oscillations arranged in proximity to said loop to induce currents of the frequency of said oscillations in said loop, and means to adjust said loop to vary the coupling between said local generator and said crystal detector.

11. A converter circuit for a superheterodyne receiver including a resonant circuit tuned to the frequency of a desired wave, said resonant circuit comprising a pair of conductors spaced apart and connected at one end to a point of fixed reference potential, a conductive element arranged in proximity of the other ends of said conductors in slidable relationship therewith to tune said resonant circuit, said conductors having complementary bores arranged therein, one of said conductors having a further axial bore connecting with the first bore located therein, a crystal mixer cartridge arranged in said complementary bores, a conductive member arranged in said further bore to form a capacitor in conjunction with the internal walls of said one conductor and connected to said crystal mixer cartridge, an amplifier input circuit connected to said conductive member, a local oscillator circuit arranged in proximity to said conductive member to couple said oscillator circuit to said crystal mixer, and means to adjust said conductive member to vary the coupling between said oscillator circuit and said crystal detector.

12. A converter circuit for a superheterodyne receiver, including a tunable transmission line section having a pair of large cross-section elongated conductors connected at one end to a point of fixed reference potential, said conductors having complementary bores therein, a crystal diode element arranged in said bores, one terminal of said crystal diode element being directly connected to the adjacent conductor and the other terminal being capacitively coupled to the other conductor, an amplifier input circuit having one terminal at said point of fixed reference potential, said other conductor having a further axial bore connected to the first bore located therein, an electric lead arranged in said further axial bore and interconnecting said crystal diode element and said amplifier input circuit, a local oscillator circuit, and connections from said local oscillator circuit to said electric lead.

13. A superheterodyne receiver structure including a conductive chassis member, a pair of elongated conductors arranged normal to said chassis member and parallel to each other, said conductors having complementary bores arranged therein, one of said conductors having a further axially arranged bore connecting with the first said bore in that conductor, a further circuit arrangement arranged on said chassis and having an input circuit, one terminal of said input circuit being connected to said chassis member, a conductor arranged in said further axial bore and connected to another terminal of said input circuit, an oscillator circuit arrangement arranged on said chassis and having an output circuit, means to couple said output circuit to said conductive member at a point outside said axial bore, the end of said conductive member within said one conductor being spaced from said conductor to form a capacitive coupling element therebetween, and terminal members arranged in said complementary bores to connect a crystal detector cartridge to the end of said conductive member within said one conductor and to said other conductor within the bore thereof.

14. A superheterodyne receiver structure including a conductive chassis member, a pair of elongated conductors arranged normal to said chassis member and parallel to each other, said conductors having complementary bores arranged therein, one of said conductors having a further axially arranged bore connecting with the first said bore in that conductor, a further circuit arrangement arranged on said chassis and having an input circuit, one terminal of said input circuit being connected to said chassis member, a conductor arranged in said further axial bore and connected to another terminal of said input circuit, an oscillator circuit arrangement arranged on said chassis and having an output circuit, means to couple said output circuit to said conductive member at a point outside said axial bore, the end of said conductive member within said one conductor being spaced from said conductor to form a capacitive coupling element therebetween, a terminal member arranged on the end of said conductive member within said one conductor to connect a crystal diode cartridge thereto and another terminal member within the bore another terminal member to connect said crystal diode cartridge thereto.

15. A single-ended converter circuit for a superheterodyne receiver including a resonant two-terminal network, a detector element and a capacitive reactance element connected in series across said resonant circuit, a circuit connected between one terminal of said two-terminal network and the junction between said detector element and said capacitive reactance element, said circuit being devoid of series connected capacity, a local oscillator coupled to said circuit connection and an amplifier circuit coupled to said circuit connection, said local oscillator coupling and said amplifier coupling being in series.

16. A single-ended converter circuit for a superheterodyne receiver as defined in claim 15 and wherein said local oscillator coupling is by induction.

17. A single-ended converter circuit for a superheterodyne receiver including a resonant two-terminal network having one terminal thereof connected to a point of fixed reference potential, a detector element and a capacitive reactance element connected in series across said resonant circuit, an amplifier input circuit coupled between one terminal of said two-terminal network and to the junction between said detector element and said capacitive reactance element, and a local oscillator coupled between said point of fixed reference potential and said junction between said capacitive reactance element and said detector element.

18. A single-ended converter circuit for a superheterodyne receiver including a resonant two-terminal network having one terminal thereof connected to a point of fixed reference potential, a detector element and a capacitive reactance element connected in series across said resonant circuit, an amplifier input circuit coupled between one terminal of said two-terminal network and to the junction between said detector element and said capacitive reactance element, and a local oscillator coupled by a further capacitive reactance element between said point of fixed reference potential and said junction between the first said capacitive reactance element and said detector element.

References Cited in the file of this patent

UNITED STATES PATENTS

| | | |
|---|---|---|
| 1,342,885 | Armstrong | June 8, 1920 |
| 2,057,170 | Usselman | Oct. 13, 1936 |
| 2,260,844 | Thomas | Oct. 28, 1941 |
| 2,410,387 | Mueller | Oct. 29, 1946 |
| 2,469,222 | Atwood | May 3, 1949 |
| 2,561,417 | Ryan et al. | July 24, 1951 |
| 2,582,726 | Van Weel | Jan. 15, 1952 |

FOREIGN PATENTS

| | | |
|---|---|---|
| 620,271 | Great Britain | Mar. 22, 1949 |

OTHER REFERENCES

Serial No. 380,368 Dallenbach (A. P. C.), published June 8, 1943.